United States Patent
Liu

(10) Patent No.: US 12,253,564 B2
(45) Date of Patent: Mar. 18, 2025

(54) MECHANISM CAPABLE OF PERFORMING ON-CHIP TEST AND VERIFICATION

(71) Applicant: Silicon Motion, Inc., Hsinchu County (TW)

(72) Inventor: Tse-Yen Liu, Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 18/122,747

(22) Filed: Mar. 17, 2023

(65) Prior Publication Data
US 2024/0310436 A1 Sep. 19, 2024

(51) Int. Cl.
*G01R 31/3177* (2006.01)
*G01R 31/317* (2006.01)

(52) U.S. Cl.
CPC ... *G01R 31/3177* (2013.01); *G01R 31/31725* (2013.01)

(58) Field of Classification Search
CPC .............. G01R 31/3177; G01R 31/31725
USPC ....................................................... 714/726
See application file for complete search history.

(56) References Cited

U.S. PATENT DOCUMENTS

| | | | |
|---|---|---|---|
| 6,331,770 B1* | 12/2001 | Sugamori | G01R 31/31905 714/724 |
| 8,010,933 B2* | 8/2011 | Hildebrant | G01R 31/31709 703/19 |
| 2008/0016422 A1* | 1/2008 | Ochi | G01R 31/31725 714/E11.155 |
| 2009/0089636 A1* | 4/2009 | Fernsler | G06F 11/2242 714/728 |
| 2011/0225470 A1* | 9/2011 | Tseng | G06F 11/27 714/704 |
| 2012/0081137 A1* | 4/2012 | Pagani | G06F 11/26 324/750.01 |
| 2013/0328583 A1* | 12/2013 | Wada | G01R 31/2884 324/750.3 |
| 2019/0163909 A1 | 5/2019 | Schilder | |
| 2020/0256913 A1 | 8/2020 | Sung | |

FOREIGN PATENT DOCUMENTS

| | | |
|---|---|---|
| TW | 201421052 A | 6/2014 |
| TW | 201704762 A | 2/2017 |
| TW | 202201030 A | 1/2022 |

* cited by examiner

*Primary Examiner* — James C Kerveros
(74) *Attorney, Agent, or Firm* — Winston Hsu

(57) ABSTRACT

An electronic device includes a functional circuit, a test mode circuit, and a verification circuit. The verification circuit generates and outputs the test waveform signals into the test mode circuit based on a clock signal provided from the test mode circuit, receives test result waveform signals from the test mode circuit when at least one test operation corresponding to the test pattern signal is performed, and compares the test result waveform signals with target result waveform signals to generate and output a failure result signal into the test mode circuit; the failure result signal is used to indicate whether at least one test bit failure occurs.

16 Claims, 6 Drawing Sheets

FIG. 2

MECHANISM CAPABLE OF PERFORMING ON-CHIP TEST AND VERIFICATION

BACKGROUND OF THE INVENTION

1. Field of the Invention

The invention relates to a test and verification scheme, and more particularly to an electronic device and a method.

2. Description of the Prior Art

Generally speaking, based on a conventional scheme, a circuit designer may send the design of a conventional chip circuit into a fabrication foundry, and the conventional chip circuit is actually produced (or mass produced) by the fabrication foundry. After the conventional chip circuit is produced, such chip circuit's functions/operations are measured, tested, and verified by an assembly and test factory which for example may perform a chip probing test procedure, a packaging test procedure, and a final test procedure. If one failure occurs during any test procedures, then the circuit designer need to cooperate with the operators of the assembly and test factory to test and solve the failure. This inevitably involves taking a long time period, a lot of communications between the designer and operators, no efficiency, and the high test cost result.

In addition, the circuit designer can only guess the occurrence reason of the failure based on the test results reported by the assembly and test factory. It becomes very difficult since the currently developed chip circuit has a more complicated design.

SUMMARY OF THE INVENTION

Therefore one of the objectives of the invention is to provide an electronic device and a corresponding method, to solve the above-mentioned problems.

According to embodiments of the invention, an electronic device is disclosed. The electronic device comprises a functional circuit, a test mode circuit, and a verification circuit. The functional circuit is coupled to at least one signal port that is to be connected to an external device, and arranged for performing at least one functional operation in response to at least one control signal sent from the external device. The test mode circuit is coupled to the functional circuit, and arranged for controlling the functional circuit performing at least one test operation in response to a test pattern signal sent from a verification circuit. The verification circuit is disposed within the electronic device and coupled to the test mode circuit, and arranged for converting the test pattern signal into a plurality of test waveform signals based on a clock signal provided from the test mode circuit, generating and outputting the plurality of test waveform signals into the test mode circuit, receiving a plurality of test result waveform signals from the test mode circuit when the at least one test operation corresponding to the test pattern signal is performed, converting a target pattern signal into a plurality of target result waveform signals, and then comparing the plurality of test result waveform signals with the plurality of target result waveform signals to determine and output a failure result signal into the test mode circuit, the failure result signal being used to indicate whether at least one failure occurs.

According to the embodiments, an electronic device is disclosed. The electronic device comprises a functional circuit, a test mode circuit, and a verification circuit. The functional circuit is coupled to at least one signal port that is to be connected to an external device, and arranged for performing at least one functional operation in response to at least one control signal sent from the external device. The test mode circuit is coupled to the functional circuit, and arranged for controlling the functional circuit performing at least one test operation in response to a test pattern signal sent from a verification circuit. The verification circuit is disposed within the electronic device and coupled to the test mode circuit, and arranged for converting the test pattern signal into a plurality of test waveform signals based on a clock signal provided from the test mode circuit, generating and outputting the plurality of test waveform signals into the test mode circuit, receiving a plurality of test result waveform signals from the test mode circuit when the at least one test operation corresponding to the test pattern signal is performed, converting a target pattern signal into a plurality of target result waveform signals, and then comparing the plurality of test result waveform signals with the plurality of target result waveform signals to determine and output an interrupt signal corresponding to a failure result signal directly into the functional circuit, the failure result signal being used to indicate whether at least one test bit failure occurs.

According to the embodiments, a method of an electronic device is disclosed. The method comprises: providing and using a functional circuit, coupled to at least one signal port that is to be connected to an external device, to perform at least one functional operation in response to at least one control signal sent from the external device; providing and using a test mode circuit to control the functional circuit performing at least one test operation in response to a test pattern signal sent from a verification circuit disposed within the electronic device; converting the test pattern signal into a plurality of test waveform signals based on a clock signal provided from the test mode circuit; generating and outputting the plurality of test waveform signals into the test mode circuit; receiving a plurality of test result waveform signals from the test mode circuit when the at least one test operation corresponding to the test pattern signal is performed; converting a target pattern signal into a plurality of target result waveform signals; and, comparing the plurality of test result waveform signals with the plurality of target result waveform signals to determine and output a failure result signal into the test mode circuit, the failure result signal being used to indicate whether at least one failure occurs.

According to the embodiments, the provided method can employ an on-chip test and verification scheme for an electronic device such as a chip circuit to shorten the trouble shooting time period of the chip circuit and achieve the reduction of testing cost for the chip circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram of an example of the test pattern signal according to an embodiment of the invention.

DETAILED DESCRIPTION

The invention aims at providing a technical solution of an on-chip test and verification mechanism and an on-chip verification circuit capable of shortening the trouble shooting time period for the test and verification of an electronic device as well as reducing the test and verification cost of electronic device. The on-chip test and verification mechanism means performing/executing test and verification operations within a chip circuit without using an external device of an assembly and test factory.

The verification circuit is disposed and implemented within a single electronic device to perform an on-chip (chip internal) test and verification. For example, in response to a design of a user such as a chip circuit designer, the electronic device can perform the on-chip test and verification by itself before the electronic device is tested by an assembly and test factory. In addition, based on the on-chip test and verification, the circuit designer may convert the test file of a test mode (or the MBIST, Memory Build-In-Self Test) into a specific format such as the Verilog format pattern, and the provided electronic device can accordingly generate test waveform signals and then verify whether the results of the test waveform signals are correct to determine whether a failure occurs. This effectively reduces human errors.

Figure 1:
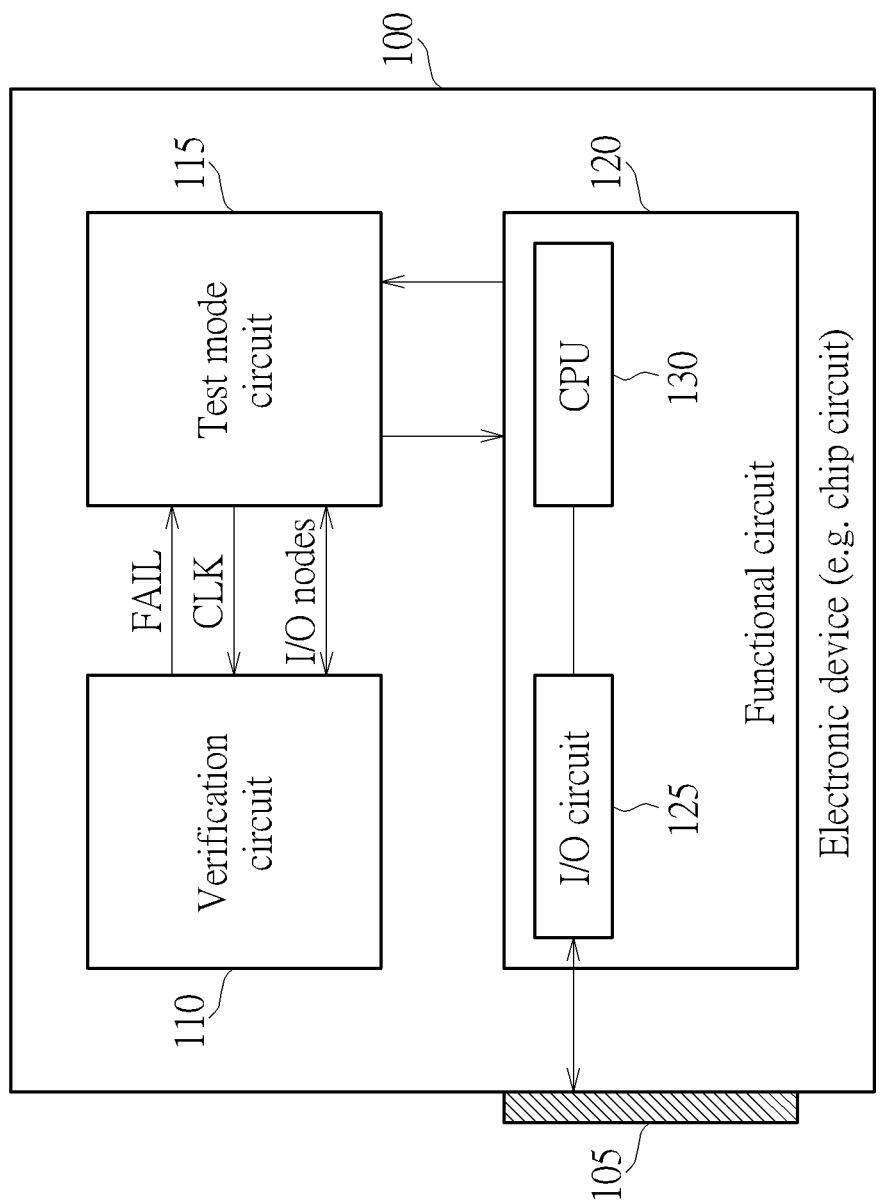
FIG. 1 is a block diagram of an electronic device according to an embodiment of the invention.

FIG. 1 is a block diagram of an electronic device 100 such as one chip circuit according to an embodiment of the invention. The electronic device 100, e.g. a flash memory controller chip circuit (but not limited), comprises at least one signal port/pin/pad 105 (e.g. one or more than two ports) to be connected/coupled to an external device, e.g. a host computer device (but not limited), and it further comprises an internal (on-chip) verification circuit 110 (which is disposed within the electronic device 100), a test mode circuit 115, and a functional circuit 120 at least having an input/output (I/O) circuit 125 and a processor circuit such as a central processing unit (CPU) 130.

The functional circuit 120 is coupled to the at least one signal port 105 that is to be coupled to the external device (not shown in FIG. 1) and is arranged for performing at least one functional operation in response to at least one control signal sent from the external device. The I/O circuit 125 is coupled between the at least one signal port 105 and the CPU 130.

The test mode circuit 115 is coupled to the functional circuit 120 and is arranged for controlling the functional circuit 120 performing at least one test operation in response to a test pattern signal sent from the verification circuit 110.

The verification circuit 110 is disposed within the electronic device 100 and coupled to the test mode circuit 115 through the input/output (I/O) interface such as I/O nodes, and it is arranged for converting the test pattern signal (e.g. the Verilog format pattern) into a plurality of test waveform signals based on the clock signal CLK provided from the test mode circuit 115, then generating and outputting the plurality of test waveform signals into the test mode circuit 115 through the I/O nodes, then receiving a plurality of test result waveform signals from the test mode circuit 115 through the I/O nodes when/after the at least one test operation corresponding to the plurality of test waveform signals is performed, then converting a target pattern signal (stored by the verification circuit 110) into a plurality of target result waveform signals based on the clock signal CLK, and then for comparing the test result waveform signals with the target result waveform signals to determine and output a plurality of failure result bits of a failure result signal FAIL into the test mode circuit 115, wherein the failure result signal FAIL is used to indicate whether at least one test bit failure occurs. For example, the clock signal CLK is a reference clock frequency signal used by the electronic device 100.

In practice, based on the test waveform signals corresponding to test pattern signal, the test mode circuit 115 may control the functional circuit 120 executing a test operation, e.g. controls the I/O circuit 125 or CPU 130 executing test operations. The results of the test operation(s) is/are transmitted back to the test mode circuit 115 which is arranged to transmit the test results (i.e. the test result waveform signals) into the verification circuit 110 through the I/O nodes, so that the verification circuit 110 respectively compares its target result waveform signals with the test result waveform signals to determine whether a failure occurs.

Figure 2:
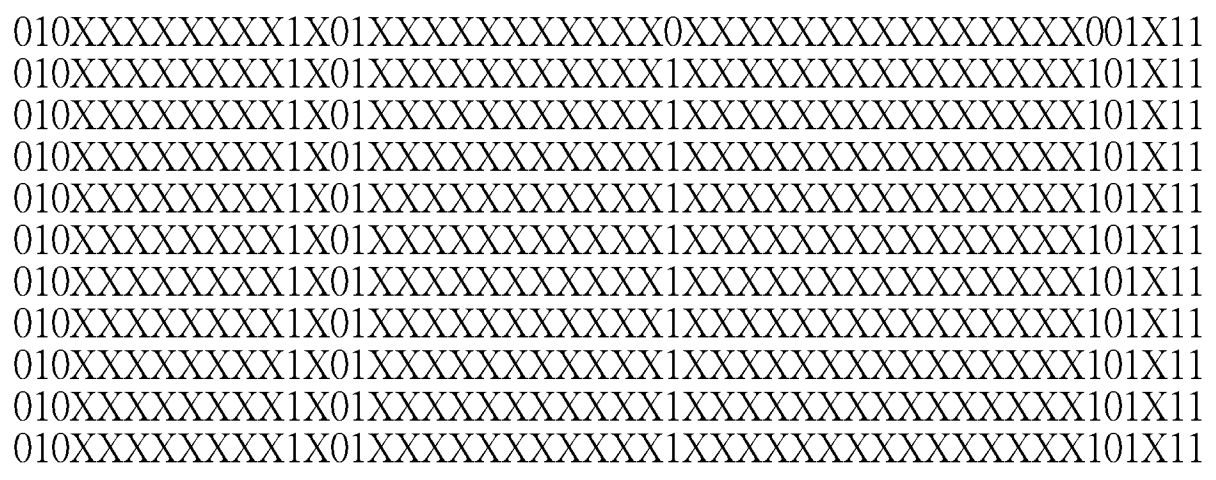

FIG. 2 is a diagram of an example of the test pattern signal according to an embodiment of the invention. For example (but not limited), a test pattern signal based on the Verilog format may sequentially comprise a sequence of test t bits carrying bit information of '0' which for example indicating a low level of a waveform signal, bit information of '1' which for example indicating a high level of a waveform signal, and bit information of 'X', wherein 'X' means don't-care information which may indicate either a low level or a high level of a waveform signal. Further, the memory circuit 1101 stores the test pattern signal and also stores a target pattern signal which comprises a sequence of target result bits of the Verilog format carrying target result information for the test and is detailed here for brevity. The test pattern signal may be identical to, different from, or partially different from the target pattern signal. This not intended to be a limitation.

For example (but not limited), the verification circuit 110, disposed within the electronic device 100, can convert a first portion of test bits (e.g. N test bits) of the test pattern signal into N test waveform signals and transmit the N test waveform signals into the test mode circuit 115 through the I/O nodes, to make the test mode circuit 115 enter a test mode in which the test mode circuit 115 (or the test control circuit 1151 in FIG. 5) for example may generate first control signals into the functional circuit 120 to simulate a first test condition and control the functional circuit 120 performing a first test operation based on the first portion of test bits corresponding to the generated first control signals. In the first test condition, the test mode circuit 115 may generate the first control signals to simulate simultaneously controlling and generating corresponding logic levels on a first portion of pins/pads 105 to control the I/O circuit 125 and/or CPU 130 executing corresponding test operation(s) and to control the functional circuit 120 reporting N test results and transmit the N test results back to the test mode circuit 115.

It should be noted that in the first test condition, the test mode circuit 115 in another example may not simulate simultaneously controlling and generating the corresponding logic levels on the first portion of pins/pads 105 and may directly control the I/O circuit 125 and/or CPU 130 executing corresponding test operation(s) to control the functional circuit 120 reporting the N test results back to the test mode circuit 115; this also falls within the scope of the invention.

Then the test mode circuit 115 generates and transmits N test result waveform signals based on the N test results into the verification circuit 110 through the I/O nodes respectively. Thus, the verification circuit 110 can compare the N test result waveform signals with corresponding N target result waveform signals converted from N bits of the target pattern signal to determine whether a failure occurs during the on-chip test and verification mechanism for the first portion of pins/pads 105 of the electronic device 100.

Further, for example (but not limited), the verification circuit 110 may convert a second portion of test bits (e.g. another N test bits following the first portion of test bits) of the test pattern signal into another N test waveform signals and transmit the another N test waveform signals into the test mode circuit 115 through the I/O nodes, to make the test mode circuit 115 enter the test mode in which the test mode circuit 115 (or the test control circuit 1151 in FIG. 5) for example may generate second control signals into the functional circuit 120 to simulate a second test condition and control the functional circuit 120 performing a second test operation based on the second portion of test bits corresponding to the generated second control signals. In the second test condition, the test mode circuit 115 may generate the second control signals to simulate simultaneously controlling and generating corresponding logic levels on a second portion of pins/pads 105 of the electronic device 100 to control the I/O circuit 125 and/or CPU 130 executing corresponding test operation(s) and to control the functional circuit 120 reporting another N test results and transmit the another N test results back to the test mode circuit 115.

It should be noted that in the second test condition, the test mode circuit 115 in another example may not simulate simultaneously controlling and generating the corresponding logic levels on the second portion of pins/pads 105 and may directly control the I/O circuit 125 and/or CPU 130 executing corresponding test operation(s) to control the functional circuit 120 reporting the another N test results back to the test mode circuit 115; this also falls within the scope of the invention.

Then the test mode circuit 115 generates and transmit another N test result waveform signals based on the another N test results into the verification circuit 110 through the I/O nodes respectively. Thus, the verification circuit 110 can compare the another N test result waveform signals with corresponding N target result waveform signals converted from another N bits of the stored target pattern signal to determine whether a failure occurs during the on-chip test and verification mechanism for the second portion of pins/pads 105 of the electronic device 100.

It should be noted that the number N can be any integer and is not intended to be a limitation. In addition, the first portion of test bits can be identical to or different from the second portion of test bits. Further, the first portion of test bits may be spaced apart from the second portion of test bits by the time period of one or more cycles of the clock signal CLK. The first portion of test bits respectively and simultaneously arrive at the test mode circuit 115 through the I/O nodes and then after waiting for one or more cycles the second portion of test bits respectively and simultaneously arrive at the test mode circuit 115 through the I/O nodes.

Compared to the conventional test scheme of the assembly and test factory, the performance of the on-chip test and verification mechanism will not affected due to the circuit limitations such as the different designs of PADs and wire routings. The verification circuit 110 can operate at a higher clock frequency higher than that used by the conventional assembly and test factory. The time cost can be saved.

Figure 3:
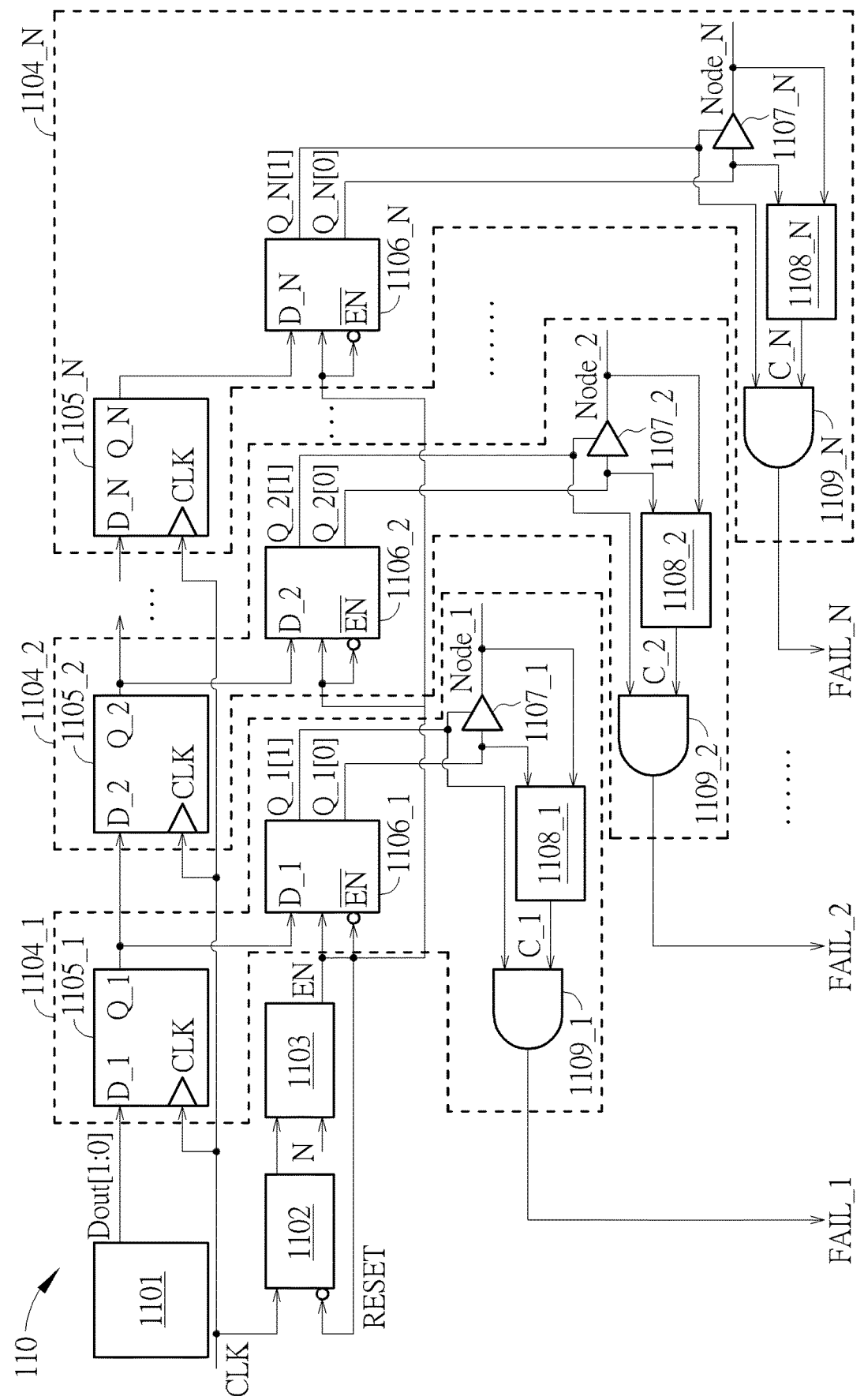
FIG. 3 is a diagram of a detailed circuit block of the verification circuit in FIG. 1 according to an embodiment of the invention.

FIG. 3 is a diagram of a detailed circuit block of the verification circuit 110 in FIG. 1 according to an embodiment of the invention. The verification circuit 110 comprises the memory circuit 1101, a counter circuit 1102, a comparator circuit 1103, and a plurality of test comparison circuits such as N test comparison circuits 1104_1, 1104_2, . . . , and 1104_N which are connected in series.

In FIG. 3, each test comparison circuit 1104_1, 1104_2, . . . , and 1104_N comprises a corresponding flip-flop circuit 1105_1, 1105_2, . . . , or 1105_N, a corresponding latch unit 1106_1, 1106_2, . . . , or 1106_N, a corresponding buffer 1107_1, 1107_2, . . . , or 1107_N, a corresponding comparator 1108_1, 1108_2, . . . , or 1108_N, and a corresponding AND gate 1109_1, 1109_2, . . . , or 1109_N. That is, the verification circuit 110 comprises N flip-flop circuits, N latch units, N buffers, N comparators, and N AND gates. The value N for example may be equal to more than two such as five or ten (but not limited), and the value N indicates the number of waveform signals transferred on the number of pins/pads of the electronic device 100 to be tested and verified respectively and simultaneously.

As shown in FIG. 3, the N flip-flop circuits 1105_1, 1105_2, . . . , and 1105_N such as N flip-flops can be connected in series to form a D-type flip-flop chain which is used as a serial-to-parallel converter that is arranged for performing a serial-to-parallel conversion upon a sequence of N test bits (or a sequence of N target result bits) to convert a sequence of N test bits (or a sequence of N target result bits) into N test waveform signals such as N test waveform levels (or N target result waveform signals such as N target result waveform levels) and transmitting and outputting the N test waveform signals (or the N target result waveform signals) respectively and simultaneously.

For example, based on the serial-to-parallel conversion, the N test comparison circuit 1104_1, 1104_2, . . . , and 1104_N can respectively and simultaneously output the N test waveform signals into the test mode circuit 115 through the N I/O nodes Node_1, Node_2, . . . , and Node_N. Similarly, the serial-to-parallel conversion can convert the sequence of N target result bits to generate the N target result waveform signals simultaneously so that the N target result waveform signals can be respectively and simultaneously compared with N test result waveform signals to determine and generate N failure result waveform signals FAIL_1, FAIL_2, . . . , and FAIL_N to form and output N bits of the failure result signal FAIL which can be used to determine whether a failure occurs or not.

The internal circuit elements of each test comparison circuits 1104_1, 1104_2, . . . , and 1104_N are digital circuits to receive, process, and output digital bit signals (or called bits), and in the following description an above-mentioned waveform signal which can indicate a low waveform level or a high waveform level is represented and indicated by a bit or a bit signal which can indicate information of low level '0' or information of high level '1' so as to make a reader more easily understand the operations and also simplify the description.

Each flip-flop circuit 1105_1, 1105_2, . . . , or 1105_N comprises a data input, a clock input, and a data output. For example, the first one flip-flop circuit 1105_1 has a data input coupled to and arranged for receiving two bits Dout[1:0] as its received signal D_1 such as two received bit signals D_1[1:0], a clock input coupled to and arranged for receiving the clock signal CLK, and a data output for outputting its output signal Q_1 such as two bit signals Q_1[1:0] into a next-stage circuit such as a next-stage flip-flop circuit (e.g. a second one flip-flop circuit 1105_2) and/or a corresponding latch unit 1106_1.

The operations of the other flip-flop circuits 1105_2, . . . , and 1105_N are similar to the operations of the flip-flop circuit 1105_1. For example, the second one flip-flop circuit 1105_2 has a data input coupled to and arranged for receiving the output signal of a previous-stage flip-flop circuit (i.e. 1105_1) as its received signal D_2 such as two received bit signals D_2[1:0], a clock input coupled to and arranged for receiving the same clock signal CLK, and a data output for outputting its output signal Q_2 such as two bit signals Q_2[1:0] into a next-stage circuit and/or its corresponding latch unit 1106_2. Similarly, the last one flip-flop circuit 1105_N has a data input coupled to and arranged for receiving the output signal of a previous-stage flip-flop circuit (i.e. 1105_(N−1), not shown in FIG. 3) as its received signal D_N such as two received bit signals D_N [1:0], a clock input coupled to and arranged for receiving the same clock signal CLK, and a data output for outputting its output signal Q_N such as two bit signals Q_N[1:0] into its corresponding latch unit 1106_N.

In FIG. 3, the memory circuit 1101 stores the test pattern signal in FIG. 2 which for example can be a predetermined or user-configured test pattern signal. For outputting the test pattern signal, the memory circuit 1101 for example is arranged to sequentially output N test bits of the test pattern signal one bit by one bit. Also, each time when outputting one test bit as the test bit Dout[0], the memory circuit 1101 is arranged to generate and output a control bit Dout[1] which may follow the test bit Dout[0] so as to form and output the two output bits Dout[1:0] into the data input of the first one flip-flop circuit 1105_1.

Each time when a cycle change or a signal edge (rising edge or falling edge) of the clock signal CLK occurs, the memory circuit 1101 outputs the two bits Dout[1:0], and also the N flip-flop circuits 1105_1, 1105_2, . . . , and 1105_N respectively transmit and use their received input bit signals as their output bit signals respectively. For example (but not limited), if the value N is equal to 5, then the first test bit may arrive at the data input of the fifth one flip-flop circuit 1105_5 (not shown in FIG. 3 for brevity) and used as the bit signal D_5[0], the second test bit may arrive at the data input of the fourth one flip-flop circuit 1105_4 (not shown in FIG. 3 for brevity) and used as the bit signal D_4 [0], the third test bit may arrive at the data input of the third one flip-flop circuit 1105_3 (not shown in FIG. 3 for brevity) and used as the bit signal D_3[0], the fourth test bit may arrive at the data input of the second one flip-flop circuit 1105_2 and used as the bit signal D_2[0], and the fifth test bit may arrive at the data input of the first one flip-flop circuit 1105_1 and used as the bit signal D_1[0], respectively, after five cycle changes or five signal edges occur. That is, the N test bits can be respectively and simultaneously transmitted to the N flip-flop circuits 1105_1, 1105_2, . . . , and 1105_N in a reversed order.

In addition, the information of the control bit Dout[1] is used to indicate/determine whether the bit Dout[0] is a test bit of the test pattern signal or it is a target result bit of the target result waveform signal. In this situation, the bit Dout[0] is a test bit, and thus the control bit Dout[1] indicates a logic level such as '0'. In a different situation, if the bit Dout[0] is a target result bit, and thus the control bit Dout[1] indicates a different logic level such as '1'. By doing so, once a cycle change or a signal edge (e.g. a rising edge or a falling edge) of the clock signal CLK occurs, the memory circuit 1101 outputs and transmits two output bits Dout[1:0] into the data input of the first one flip-flop circuit 1105_1. Based on the above operations, after N cycles, the N test bits respectively followed by N control bits can be respectively received by the N flip-flop circuits 1105_1, 1105_2, . . . , and 1105_N in a reversed order. It should be noted that, in another example, if the memory circuit 1101 is used to output N target result bits, then after N cycles the N target result bits respectively followed by another N control bits can be also respectively received by the N flip-flop circuits 1105_1, 1105_2, . . . , and 1105_N in the same reversed order.

The counter circuit 1102 has a first input coupled to and arranged for receiving the clock signal CLK, a second input coupled to and arranged for receiving the reset signal RESET, and a data output coupled to a data input of the comparator circuit 1103. The counter circuit 1102 is used to increment and count a counting value from zero to the value N according to cycles (e.g. rising/falling edges) of the clock signal CLK and to transmit the currently counting value at its data output, wherein the value N indicates the number of test bits for the testing and verified simultaneously and it may be equal to ten (but not limited). Each time when the cycle change or signal edge occurs, the counter circuit 1102 is arranged to generate and transmit the currently counting value into the first data input of the comparator circuit 1103.

The comparator circuit 1103 has the first data input coupled to and arranged for receiving the currently counting value generated and sent from the counter circuit 1102, a second data input coupled to and arranged for receiving the specific value N such as a fixed value, and a data output for generating and transmitting a trigger signal such as the enable signal EN into all the latch units 1106_1, 1106_2, . . . , and 1106_N respectively. The comparator circuit 1103 is arranged to compare the currently received counting value with the specific value N to determine whether to generate the trigger signal such as the enable signal EN. In this example, the enable signal EN is generated only when the currently received counting value is equal to the specific value N.

In addition, the enable signal EN is also used as the reset signal RESET for the counter circuit 1102. That is, each time when generating the enable signal EN, the counting value of the counter circuit 1102 is reset as zero by the reset signal RESET generated from the comparator circuit 1103 and then the counter circuit 1102 is restarted to count. In addition, the enable signal EN is also coupled to the different data inputs of all the latch units 1106_1, 1106_2, . . . , and 1106_N through the inverters to generate the enable bar signal $\overline{EN}$ for all the latch units 1106_1, 1106_2, . . . , and 1106_N.

Figure 4:
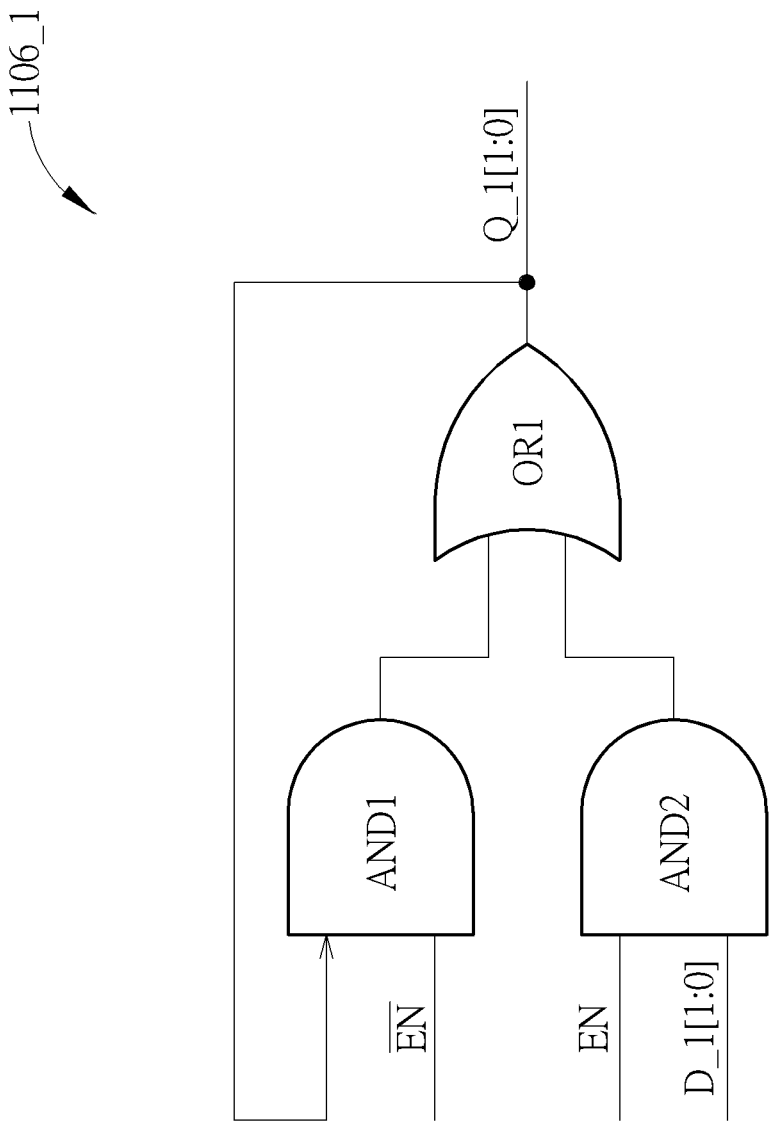
FIG. 4 is a circuit diagram of a latch unit according to an embodiment of the invention.

Further, in practice, each latch unit 1106_1, 1106_2, . . . , and 1106_N may be implemented by using logic gates. FIG. 4 is a circuit diagram of a latch unit such as 1106_1 (but not limited) according to an embodiment of the invention. For example (but not limited), the latch unit 1106_1 comprises two AND gates AND1 and AND2 and an OR gate OR1.

As shown in FIG. 4, the first AND gate AND1 has a first data input coupled to and arranged for receiving the output bit signals Q_1[1:0] of the OR gate OR1, a second data input coupled to and arranged for receiving the enable bar signal $\overline{EN}$ mentioned above, and a data output coupled to a first data input of the OR gate OR1 and arranged for generating a first AND output signal to the OR gate OR1.

The second AND gate AND2 has a first data input coupled to and arranged for receiving the enable signal EN, a second data input coupled to and arranged for receiving its two input bit signals D_1[1:0], and a data output coupled to a second data input of the OR gate OR1 and arranged for generating a second AND output signal to the OR gate OR1.

The OR gate OR1 has the first data input coupled to the data output of the first AND gate AND1, the second data input coupled to the data output of the second AND gate AND2, and the data output arranged for generating the output bit signals Q_1[1:0] of the latch unit 1106_1.

Refer to FIG. 3 in conjunction with FIG. 4. When the trigger signal is generated from the comparator circuit 1103 as the enable signal EN if the currently received counting value is equal to the specific value N, the enable signal EN for example carries the logic level '1', and the enable bar signal $\overline{EN}$ carries the logic level '0'. The enable signal EN carrying the logic level '1' and the enable bar signal $\overline{EN}$ carrying the logic level '0' are transmitted into all the latch units 1106_1, 1106_2, ..., and 1106_N.

For the latch unit 1106_1, when the enable signal EN for example carries the logic level '1' and the enable bar signal $\overline{EN}$ carries the logic level '0', no matter what the information of the input bit signals D_1[1:0] in FIG. 4 indicates, the information of the input bit signals D_1[1:0] can be transmitted from the second data input of the second AND gate AND2 into the data output of the second AND gate AND2 since the second AND gate AND2 receives the enable signal EN carrying the logic level '1' at its first data input. Similarly, no matter what the information of the previous output bit signals Q_1[1:0] indicates, the information of the previous output bit signals Q_1[1:0] cannot be transmitted from the first data input of the first AND gate AND1 into the data output of the first AND gate AND1 since the first AND gate AND1 receives the enable bar signal $\overline{EN}$ carrying the logic level '0' at its second data input.

That is, in this situation, the OR gate OR1 receives the logic level '0' at its first data input and receives the information of the input bit signals D_1[1:0] at its second data input, and thus the OR gate OR1 can correctly transmit and output the information of the input bit signals D_1[1:0] into its data output as the information of the new output bit signals Q_1[1:0] no matter what the information of the input bit signals D_1[1:0] indicates. By doing so, when the comparator circuit 1103 generates and outputs the enable signal EN carrying the logic level '1', the enable signal EN carrying the logic level '1' and the enable bar signal $\overline{EN}$ carrying the logic level '0' are received by the N latch units 1106_1, 1106_2, ..., and 1106_N, and the N latch units 1106_1, 1106_2, ..., and 1106_N can respectively perform their latch operations upon their received input bit signals D_1[1:0], D_2[1:0], ..., and D_N[1:0] as their output bit signals Q_1[1:0], Q_2[1:0], ..., and Q_N[1:0].

Further, the output bit signals of a latch unit are respectively transmitted into different input terminals of a corresponding buffer. For example, for the latch unit 1106_1, the output bit signal Q_1[0] is transmitted into the data input of the buffer 1107_1 and is also transmitted into a first data input of a corresponding comparator such as 1108_1, and the output bit signal Q_1[1] is transmitted into the control input of the buffer 1107_1 and also transmitted into a first data input of a corresponding AND gate such as 1109_1.

The above operations are similar for the other latch units and the other buffers, and are not detailed for brevity.

For example, for the latch unit 1106_1, the first output bit signal Q_1[0] of the latch unit 1106_1 is outputted into the data input of the buffer 1107_1, and the second output bit signal Q_1[1] of the latch unit 1106_1 is used as an enable bar control signal for the buffer 1107_1 and to enable or disable (i.e. turn on/off) the buffer 1107_1. For instance, the buffer 1107_1 has the data input coupled to and arranged for receiving the first output bit signal Q_1[0] of latch unit 1106_1, has a data output coupled to and arranged for generating the buffered bit signal Q_1[0] into an input/output (I/O) node Node_1 if the corresponding buffer 1107_1 is enabled, and the control input coupled to and arranged for receiving the bit signal Q_1[1] as the enable bar control signal of the corresponding buffer 1107_1.

In practice, the buffer 1107_1 is enabled if the bit signal Q_1[1] as the enable bar control signal indicates the logic level '0', and the buffer 1107_1 is disabled if the bit signal Q_1[1] indicates the logic level '1'. That is, the corresponding buffer 1107_1 becomes disconnected and does not transmit the bit signal Q_1[0] into the I/O node Node_1 if the corresponding buffer 1107_1 is disabled by the bit signal Q_1[1] which for example carries the information of logic level '1' that indicates that the bit signal Q_1[0] carries the information of a target result bit.

Alternatively, the corresponding buffer 1107_1 is enabled and arranged to transmit the bit signal Q_1[0] into the I/O node Node_1 if the bit signal Q_1[1] carries the information of logic level '0' that indicates that the bit signal Q_1[0] carries the information of a test bit.

The operations of the other buffers are similar to the operations of the buffer 1107_1, and not detailed for brevity.

Further, the comparator 1108_1 has the first data input coupled to and arranged for receiving the information of the bit signal Q_1[0] sent from the corresponding latch unit 1106_1, a second data input coupled to the I/O node Node_1 and arranged for receiving the waveform signal outputted from the corresponding buffer 1107_1 or the waveform signal received from the I/O node Node_1, and a data output coupled to the AND gate 1109_1. The comparator 1108_1 is arranged to compare the logic information/level of bit signal Q_1[0] with that of the waveform signal outputted from the buffer 1107_1 or that of the waveform signal received from the I/O node Node_1 to generate a comparison signal such as C_1 into the second data input of the corresponding AND gate 1109_1. The operations of the other comparators are similar to the operations of the comparator 1108_1, and not detailed for brevity.

The corresponding AND gate 1109_1 has the first data input coupled to and arranged for receiving the bit signal Q_1[1], the second data input coupled to and arranged for receiving the comparison signal C_1 sent from the comparator 1108_1, and a data output for generating and outputting a fail information waveform signal such as a fail information bit signal FAIL_1 based on its logic AND operation performed upon the logic information/level of bit signal Q_1[1] and the logic information/level of comparison signal C_1 of the corresponding comparator 1108__1. For example, if the bit signal Q_1[0] carries the information of a test bit, then the bit signal Q_1[1] carries the logic level '0' and thus the corresponding buffer 1107_1 is enabled by the bit signal Q_1[1] since the bit signal Q_1[1] is used as the enable bar control signal for the corresponding buffer 1107_1 and then the bit signal Q_1[0] (i.e. the information of such test bit) is transmitted into the I/O node Node_1 to generate and output a corresponding test waveform signal so that the waveform signal of such test bit can transmitted and outputted to the test mode circuit 115 through the I/O node Node_1.

In this situation, the comparator 1108_1 receives the same information of the bit signal Q_1[0] at its first and second data inputs, so that the comparison signal C_1 of the corresponding comparator 1108_1 in this situation indicates the logic level '1'. At this time, the corresponding AND gate 1109_1 receives the bit signal Q_1[1] carrying the logic level '0' and the comparison signal C_1 carrying the logic level '1' and thus generates the logic level '0' at its data output as the resultant logic information/level of the fail information bit signal FAIL_1, i.e. the resultant information '0' indicates that no failures or this is not a fail information. In this situation, no matter what the comparison signal C_1 indicates, the data output of the corresponding AND gate 1109_1 generates the logic level '0' since the bit signal Q_1[1] indicates the logic level '0'.

Alternatively, if the bit signal Q_1[0] carries t information of a target result bit, then the bit signal Q_1[1] carries the logic level '1' and thus the corresponding buffer 1107_1 is disabled correspondingly and the bit signal Q_1[0] (i.e. the information of such target result bit) cannot be transmitted into the I/O node Node_1. In this situation, a corresponding test result waveform signal can be transmitted from the test mode circuit 115 through the I/O node Node_1 into the second data input of the comparator 1108_1, so that the comparator 1108_1 can receive the target result waveform signal of the target result bit at its first data input and receive the test result waveform signal at its second data input to compare the levels of the two signals. If the levels of the two signals are equal, then the comparison signal C_1 generated by the comparator 1108_1 indicates the logic level '0' (i.e. no failures) and is transmitted into the second data input of the AND gate 1109_1. In this situation, the AND gate 1109_1 receives the bit signal Q_1[1] indicating the logic level '1' at its first data input and receives the comparison signal C_1 carrying the logic level '0' at its second data input, and thus it generates the logic level '0' at its data output as the resultant logic information/level of the fail information bit signal FAIL_1, i.e. the resultant information '0' indicates that no failure occurs for this test result waveform signal.

Alternatively, if the level of test result waveform signal is different from that of the target result waveform signal (i.e. a failure occurs for the corresponding test bit), then the comparison signal C_1 generated by the comparator 1108_1 indicates the logic level '1' and is transmitted into the second data input of the AND gate 1109_1. In this situation, the AND gate 1109_1 receives the bit signal Q_1[1] indicating the logic level '1' at its first data input and receives the comparison signal C_1 carrying the logic level '1' at its second data input, and thus it generates the logic level '1' at its data output as the resultant logic information/level of the fail information bit signal FAIL_1, i.e. the resultant information '1' indicates that a failure occurs for this test result waveform signal.

The operations and functions of the other test comparison circuits comprising the other flip-flop circuits, the other latch units, the other buffers, the other comparators, and the other AND gates are similar to the above mentioned operations, and are not detailed for brevity.

By doing so, the N test comparison circuits 1104_1, 1104_2, and ..., and 1104_N can be respectively used to convert the N test bits into N test waveform signals, transmitting and outputting the N test waveform signals into the test mode circuit 115 through N different I/O nodes Node_1, Node_2, ..., and Node_N respectively and simultaneously, and can be also used to respectively receive N test result waveform signals through the N different I/O nodes Node_1, Node_2, ..., and Node_N respectively, and then respectively compare their received test result waveform signals with their target result waveform signals (converted from N bits of the target pattern signal stored by the memory circuit 1101) to respectively determine whether a failure occurs or not for the corresponding N test bits.

The fail information bit signals FAIL_1, FAIL_2, ..., and FAIL_N can be used to form the failure result signal FAIL carrying N bits in which the logic level '0' means no failures while the logic level '1' means a bit failure's occurring. The failure result signal FAIL is then transmitted to the test mode circuit 115, and the test mode circuit 115 can be arranged to perform a corresponding debug control operation in response to the failure result signal FAIL if at least one bit of the failure result signal FAIL carries the logic level '1'.

Figure 5:
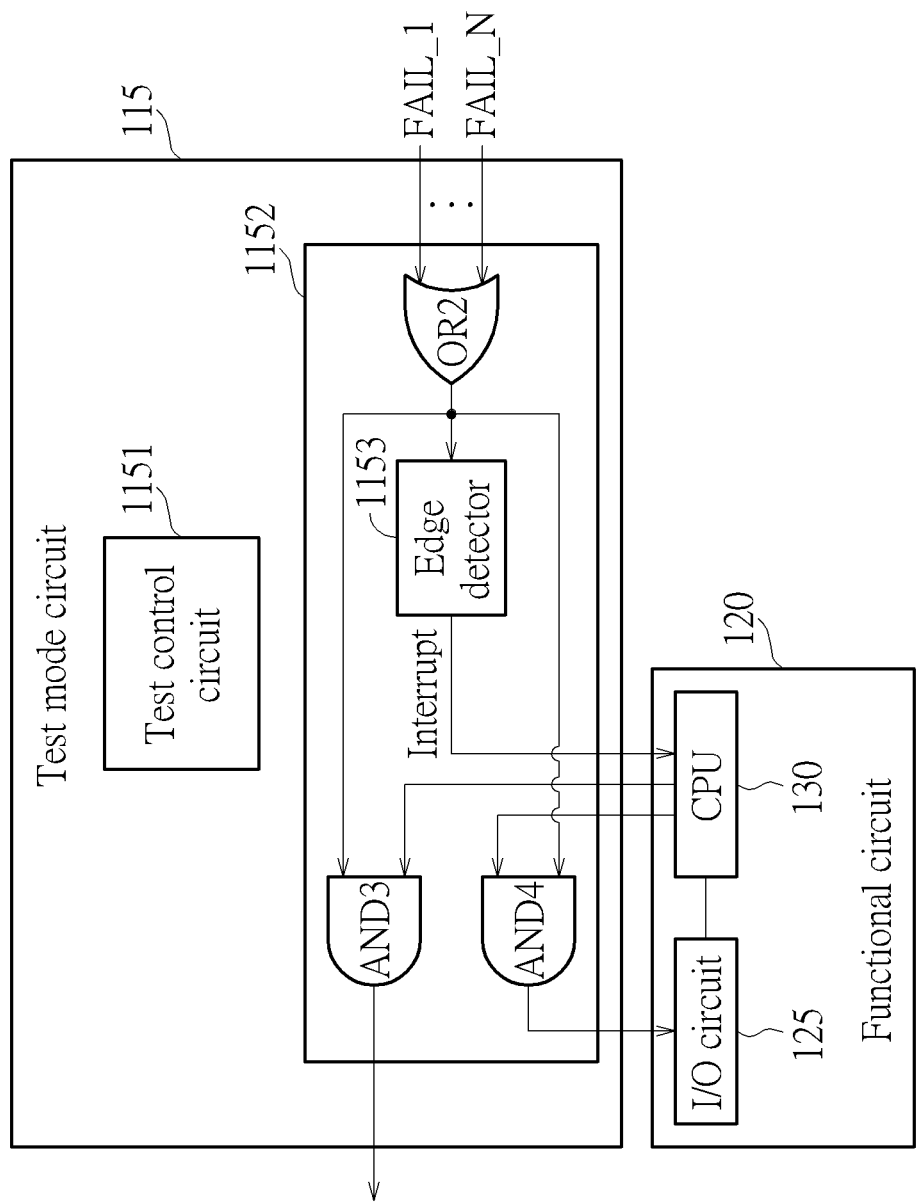
FIG. 5 is a circuit diagram of a test mode circuit in FIG. 1 according to an embodiment of the invention.

FIG. 5 is a circuit diagram of a test mode circuit 115 in FIG. 1 according to an embodiment of the invention. The test mode circuit 115 comprises the test control circuit 1151 and a processing circuit 1152. The processing circuit 1152 comprises an edge detector 1153 and a portion of logic gates such as an OR gate OR2 and two AND gates AND3 and AND4. The OR gate OR2 has N data inputs respectively coupled to and arranged for receiving the logic information (or waveform levels) of N bits of the failure result signal FAIL generated from the verification circuit 110 in FIG. 3, and also has a data output coupled to a data input of the edge detector 1153, a first data input of the first AND gate AND3 and a second data input of the second AND gate AND4.

The edge detector 1153 has the data input coupled to the OR gate OR2 and has a data output coupled to the CPU 130 disposed within the functional circuit 120.

The first AND gate AND3 has the first data input coupled to the data output of OR gate OR2, has a second data input coupled to the CPU 130 disposed within the functional circuit 120, and also has a data output.

The second AND gate AND4 has a first data input coupled to the CPU 130 disposed within the functional circuit 120, has the second data input coupled to the data output of OR gate OR2, and has a data output coupled to the I/O circuit 125 disposed within the functional circuit 120.

In FIG. 5, the N bit signals of the failure result signal FAIL generated from the verification circuit 110 in FIG. 3 are respectively inputted into the N data inputs of the OR gate OR2 which is arranged to perform a logic OR operation upon its received N input bit signals. Thus, only when all the N bits of the failure result signal FAIL indicate the logic level '0', the OR gate OR2 generates and outputs the logic level '0' into the edge detector 1153. Once at least one test failure corresponding to at least one logic level indicating '1' occurs in the failure result signal FAIL, the OR gate OR2 can generate and output the logic level '1' into the edge detector 1153. In addition, the logic level outputted by the OR gate OR2 is also transmitted into the first data input of the first AND gate AND3 and into the second data input of the second AND gate AND4.

The edge detector 1153 is arranged to generate an interrupt signal in response to the logic level outputted by the OR gate OR2. If the logic level outputted by the OR gate OR2 indicates '0', the edge detector 1153 does not generate and output the interrupt signal. If the logic level outputted by the OR gate OR2 indicates '1', the edge detector 1153 is arranged to generate and output the interrupt signal into the CPU 130 to interrupt the operations of the CPU 130. That is, once at least one test bit failure occurs, the CPU 130 will be interrupted and is arranged to transmit a first control signal to the first AND gate AND3 and transmit a second control signal to the second AND gate AND4.

When the CPU 130 determines generating an error information signal back to the verification circuit 110, the CPU 130 can generate the first control signal carrying the logic level '1' into the second data input of the first AND gate AND3 after receiving the interrupt signal from the edge detector 1153. In this situation, the first AND gate AND3 performs a logic AND operation upon the first control signal carrying the logic level '1' and the failure result signal FAIL to generate and transmit an error information signal, which indicates the test failure bits and/or error condition (s), to the memory circuit 1101 disposed within the verification circuit 110.

Alternatively, if the CPU 130 determines not generating error information back to the verification circuit 110, the CPU 130 can generate the first control signal carrying the logic level '0' into the second data input of the first AND gate AND3 after receiving the interrupt signal from the edge detector 1153. In this situation, the first AND gate AND3 performs a logic AND operation upon the first control signal carrying the logic level '0' and the failure result signal FAIL, so that such error information signal, which indicates the test failure bits and/or error condition (s), is not transmitted to the memory circuit 1101 disposed within the verification circuit 110.

Similarly, when the CPU 130 determines generating an error status signal to the I/O circuit 125 disposed within functional circuit 120, the CPU 130 can generate the second control signal carrying the logic level '1' into the first data input of the second AND gate AND4 after receiving the interrupt signal from the edge detector 1153. In this situation, the second AND gate AND4 performs a logic AND operation upon the second control signal carrying the logic level '1' and the failure result signal FAIL to generate and transmit an error status signal, which indicates the error status, to the I/O circuit 125 disposed within the functional circuit 120.

Alternatively, if the CPU 130 determines not generating the error status to the I/O circuit 125, the CPU 130 can generate the second control signal carrying the logic level '0' into the first data input of the second AND gate AND4 after receiving the interrupt signal from the edge detector 1153. In this situation, the second AND gate AND4 performs the logic AND operation upon the second control signal carrying the logic level '0' and the failure result signal FAIL, so that such error status signal is not generated and transmitted to the I/O circuit 125.

It should be noted that, if the error status signal is generated and transmitted to the I/O circuit 125, then the I/O circuit 125 can provide the error status signal to an external circuit which can display and report the error status for the user.

That is, trouble shooting, the on-chip test and verification mechanism can cooperate with the CPU 130 or I/O circuit 125 to generate and record/store the tested error information and corresponding condition (s) in the memory circuit 1101 of the verification circuit 110 and to control the I/O circuit 125 notifying a user device (e.g. an external computer device) of a corresponding error status report.

Figure 6:
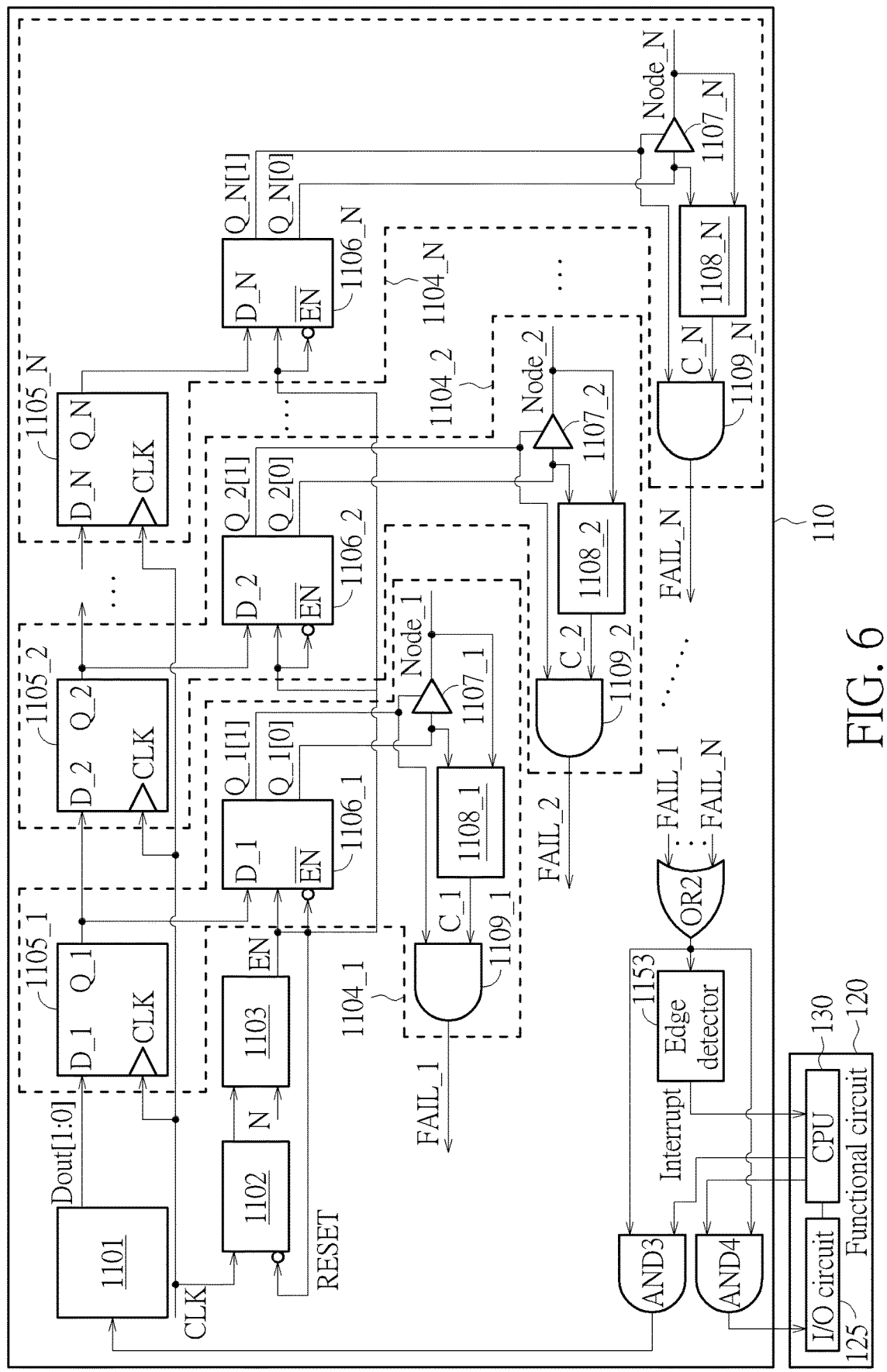
FIG. 6 is a diagram of a different example of the verification circuit in FIG. 1 according to another embodiment of the invention.

In one embodiment, the processing circuit 1152 in FIG. 5 can be implemented within the verification circuit 110, and thus the verification circuit 110 may directly generate the above-mentioned interrupt signal into the CPU 130 disposed within the functional circuit 120, instead of using the test mode circuit 115. FIG. 6 is a diagram of a different circuit example of the verification circuit 110 in FIG. 1 according to another embodiment of the invention. In FIG. 6, the verification circuit 110 further comprises the circuit elements of the processing circuit 1152 as shown in FIG. 5. The operations and functions are similar and are not detailed for brevity.

In the embodiments, based on the on-chip test and verification mechanism, the test mode circuit 115 (or test control circuit 1151 in FIG. 5) can also test and verify the clock frequency of clock signal CLK or CPU clock frequency of CPU 130. The test and verification results can be sent to the I/O circuit 125 so that the test and verification results can be outputted to an external device which can be used to measure the actual value of the clock frequency of clock signal CLK or CPU clock frequency of CPU 130. For example (but not limited), the test mode circuit 115 (or test control circuit 1151 in FIG. 5) based on the received test pattern signal may control the functional circuit 120 performing CPU clock frequency test and reporting the value of CPU clock frequency back to the test mode circuit 115. Also, the on-chip test and verification mechanism can be used to test and verify the state of a flash memory, the state machine of the flash memory, memory data testing, memory module testing, and/or memory data writing and then ECC (Error-Correcting Code) checking. Also, the test mode circuit 115 (or test control circuit 1151 in FIG. 5) may comprise different test circuits (not shown in FIG. 5) of command queues, power, ECC, DRAM (Dynamic Random Access Memory), SRAM (Static Random Access Memory), and so on. The test pattern signal sent from the verification circuit 110 equivalently is used to trigger a corresponding test operation of a corresponding portion/module/circuit of the above different test circuits.

It should be noted that the provided on-chip test and verification mechanism can be applied into different kinds of chip circuits such as a flash memory controller chip or the other control chips having pins/pads/ports which are needed to tested and verified simultaneously and respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
a functional circuit, disposed within the electronic device and coupled to at least one signal port that is to be connected to an external device externally coupled to the electronic device, for performing at least one functional operation in response to at least one control signal sent from the external device;
a test mode circuit, coupled to the functional circuit, for controlling the functional circuit performing at least one test operation in response to a test pattern signal sent from a verification circuit; and
the verification circuit, disposed within the electronic device and coupled to the test mode circuit, for performing an on-chip test and verification operation upon the function circuit by converting the test pattern signal into a plurality of test waveform signals based on a clock signal provided from the test mode circuit, generating and outputting the plurality of test waveform signals into the test mode circuit, receiving a plurality of test result waveform signals from the test mode circuit when the at least one test operation corresponding to the test pattern signal is performed, converting a target pattern signal into a plurality of target result waveform signals, and then comparing the plurality of test result waveform signals with the plurality of target result waveform signals to determine and output a failure result signal into the test mode circuit, the failure result signal being used to indicate whether at least one failure occurs;
wherein the electronic device is a flash memory controller chip circuit; and, the verification circuit comprises:

a memory circuit, arranged for storing the test pattern signal and the target pattern signal;

a counter circuit, arranged for counting and outputting a counting value into a comparator circuit in response to a signal edge of the clock signal;

the comparator circuit, coupled to the counter circuit, for generating and outputting a trigger signal as an enable signal into a plurality of test comparison circuits respectively when the counting value is equal to a specific value; and the plurality of test comparison circuits, arranged for receiving a plurality of test bits of the test pattern signal to perform a serial-to-parallel conversion upon the plurality of test bits to output the plurality of test waveform signals into the test mode circuit through a plurality of input/output nodes respectively, receiving the plurality of test result waveform signals from the test mode circuit respectively through the plurality of input/output nodes, receiving a plurality of target result bits of the target pattern signal to perform the serial-to-parallel conversion upon the plurality of target result bits to generate the plurality of target result waveform signals to respectively compare the plurality of target result waveform signals with the plurality of test result waveform signals to generate a plurality of fail information bit signals so as to form and output the failure result signal.

2. The electronic device of claim 1, wherein the electronic device is the flash memory controller chip circuit, and the external device is a host computer device.

3. The electronic device of claim 1, wherein a specific test comparison circuit in the plurality of test comparison circuits comprises:

a specific flip-flop circuit, having a clock input coupled to the clock signal, a data input coupled to data bits of the memory circuit or data bits of a previous-stage flip-flop circuit of a previous-stage test comparison circuit, and a data output coupled to a next-stage flip-flop circuit of a next-stage test comparison circuit;

a specific latch unit, having a data input coupled to the data output of the specific flip-flop circuit, having an enable input coupled to the trigger signal of the comparator circuit, having an enable bar input coupled to an inversion of the trigger signal of the comparator circuit, having a first data output bit coupled to a specific buffer and a specific comparator, and having a second data output bit coupled to the specific buffer and a specific AND gate;

a specific input/output node, coupled between the specific test comparison circuit and the test mode circuit;

the specific buffer, having a data input coupled to the first data output bit of the specific latch unit, having a data output coupled to the specific input/output node, and having an enable bar control input coupled to the second data output bit of the specific latch unit;

the specific comparator, having a first data input coupled to the first data output bit of the specific latch unit, having a second data input coupled to the specific input/output node, and having a data output coupled to the specific AND gate; and the specific AND gate, having a first data input coupled to the second data output bit of the specific latch unit, having a second data input coupled to the data output of the specific comparator, and having a data output for generating and outputting a specific fail information bit signal.

4. The electronic device of claim 3, wherein a plurality of flip-flop circuits respectively comprised in the plurality of test comparison circuits are serially connected.

5. The electronic device of claim 3, wherein the specific latch unit comprises:

a first AND gate, having a first data input coupled to a data output of a first OR gate, having a second data input coupled to the inversion of the trigger signal of the comparator circuit, and having a data output coupled to a first data input of the first OR gate;

a second AND gate, having a first data input coupled to the trigger signal of the comparator circuit, having a second data input coupled to the data output of the specific flip-flop circuit, and having a data output coupled to a second data input of the first OR gate; and the first OR gate, having the first data input coupled to the data output of the first AND gate, having the second data input coupled to the data output of the second AND gate, and having the data output coupled to the first data input of the first AND gate;

wherein the first data output bit and the second data output bit are sequentially generated from the data output of the first OR gate.

6. The electronic device of claim 1, wherein the test mode circuit comprises:

a test control circuit; and a processing circuit, coupled to the test control circuit, comprising:

a second OR gate, having a plurality of data inputs respectively coupled to a plurality of fail information bit signals of the failure result signal, and having a data output coupled to an edge detector;

the edge detector, coupled to the second OR gate, arranged for generating an interrupt signal into the functional circuit in response to a signal edge of the data output of the second OR gate;

a third AND gate, having a first data input coupled to the data output of the second OR gate, having a second data input coupled to the functional circuit, and having a data output coupled to the verification circuit; and a fourth AND gate, having a first data input coupled to the functional circuit, having a second data input coupled to the data output of the second OR gate, and having a data output coupled to the functional circuit.

7. The electronic device of claim 6, wherein the functional circuit comprises:

a processor circuit, coupled to the data output of the edge detector, the second data input of the first AND gate, and the first data input of the second AND gate, arranged for determining whether to generate an error information signal from the data output of the first AND gate into the verification circuit and arranged for determining whether to generate an error status signal from the data output of the second AND gate into an input/output circuit of the functional circuit; and the input/output circuit, coupled between the processor circuit and the at least one signal port-and coupled to the data output of the second AND gate.

8. An electronic device, comprising:

a functional circuit, disposed within the electronic device and coupled to at least one signal port that is to be connected to an external device externally coupled to the electronic device, for performing at least one functional operation in response to at least one control signal sent from the external device;

a test mode circuit, coupled to the functional circuit, for controlling the functional circuit performing at least one test operation in response to a test pattern signal sent from a verification circuit; and the verification circuit, disposed within the electronic device and coupled to the test mode circuit, for performing an on-chip test and verification operation upon the function circuit by converting the test pattern signal into a plurality of test waveform signals based on a clock signal provided from the test mode circuit, generating and outputting the plurality of test waveform signals into the test mode circuit, receiving a plurality of test result waveform signals from the test mode circuit when the at least one test operation corresponding to the test pattern signal is performed, converting a target pattern signal into a plurality of target result waveform signals, and then comparing the plurality of test result waveform signals with the plurality of target result waveform signals to determine and output an interrupt signal corresponding to a failure result signal directly into the functional circuit, the failure result signal being used to indicate whether at least one test bit failure occurs;

wherein the electronic device is a flash memory controller chip circuit; the verification circuit comprises:

a memory circuit, arranged for storing the test pattern signal and the target pattern signal;

a counter circuit, arranged for counting and outputting a counting value into a comparator circuit in response to a signal edge of the clock signal;

the comparator circuit, coupled to the counter circuit, for generating and outputting a trigger signal as an enable signal into a plurality of test comparison circuits respectively when the counting value is equal to a specific value;

the plurality of test comparison circuits, arranged for receiving a plurality of test bits of the test pattern signal to perform a serial-to-parallel conversion upon the plurality of test bits to output the plurality of test waveform signals into the test mode circuit through a plurality of input/output nodes respectively, receiving the plurality of test result waveform signals from the test mode circuit respectively through the plurality of input/output nodes, receiving a plurality of target result bits of the target pattern signal to perform the serial-to-parallel conversion upon the plurality of target result bits to generate the plurality of target result waveform signals to respectively compare the plurality of target result waveform signals with the plurality of test result waveform signals to generate a plurality of fail information bit signals so as to form and output the failure result signal; and a processing circuit, coupled to the plurality of test comparison circuits, arranged for generating an error information signal into the memory circuit in response to the failure result signal and a decision of the functional circuit, and arranged for generating an error status signal in response to the failure result signal and the decision of the functional circuit.

9. The electronic device of claim 8, wherein the electronic device is the flash memory controller chip circuit, and the external device is a host computer device.

10. The electronic device of claim 8, wherein a specific test comparison circuit in the plurality of test comparison circuits comprises:

a specific flip-flop circuit, having a clock input coupled to the clock signal, a data input coupled to data bits of the memory circuit or data bits of a previous-stage flip-flop circuit of a previous-stage test comparison circuit, and a data output coupled to a next-stage flip-flop circuit of a next-stage test comparison circuit;

a specific latch unit, having a data input coupled to the data output of the specific flip-flop circuit, having an enable input coupled to the trigger signal of the comparator circuit, having an enable bar input coupled to an inversion of the trigger signal of the comparator circuit, having a first data output bit coupled to a specific buffer and a specific comparator, and having a second data output bit coupled to the specific buffer and a specific AND gate;

a specific input/output node, coupled between the specific test comparison circuit and the test mode circuit;

the specific buffer, having a data input coupled to the first data output bit of the specific latch unit, having a data output coupled to the specific input/output node, and having an enable bar control input coupled to the second data output bit of the specific latch unit;

the specific comparator, having a first data input coupled to the first data output bit of the specific latch unit, having a second data input coupled to the specific input/output node, and having a data output coupled to the specific AND gate; and the specific AND gate, having a first data input coupled to the second data output bit of the specific latch unit, having a second data input coupled to the data output of the specific comparator, and having a data output for generating and outputting a specific fail information bit signal.

11. The electronic device of claim 10, wherein a plurality of flip-flop circuits respectively comprised in the plurality of test comparison circuits are serially connected.

12. The electronic device of claim 10, wherein the specific latch unit comprises:

a first AND gate, having a first data input coupled to a data output of a first OR gate, having a second data input coupled to the inversion of the trigger signal of the comparator circuit, and having a data output coupled to a first data input of the first OR gate;

a second AND gate, having a first data input coupled to the trigger signal of the comparator circuit, having a second data input coupled to the data output of the specific flip-flop circuit, and having a data output coupled to a second data input of the first OR gate; and the first OR gate, having the first data input coupled to the data output of the first AND gate, having the second data input coupled to the data output of the second AND gate, and having the data output coupled to the first data input of the first AND gate;

wherein the first data output bit and the second data output bit are sequentially generated from the data output of the first OR gate.

13. The electronic device of claim 8, wherein the processing circuit comprises:

a second OR gate, having a plurality of data inputs respectively coupled to a plurality of fail information bit signals of the failure result signal, and having a data output coupled to an edge detector;

the edge detector, coupled to the second OR gate, arranged for generating an interrupt signal into the functional circuit in response to a signal edge of the data output of the second OR gate;

a third AND gate, having a first data input coupled to the data output of the second OR gate, having a second data input coupled to the functional circuit, and having a data output coupled to the memory circuit; and a fourth AND gate, having a first data input coupled to the functional circuit, having a second data input coupled to the data output of the second OR gate, and having a data output coupled to the functional circuit.

14. The electronic device of claim 13, wherein the functional circuit comprises:

a processor circuit, coupled to the data output of the edge detector, the second data input of the first AND gate, and the first data input of the second AND gate, arranged for determining whether to generate an error information signal from the data output of the first AND gate into the verification circuit and arranged for determining whether to generate an error status signal from the data output of the second AND gate into an input/output circuit of the functional circuit; and the input/output circuit, coupled between the processor circuit and the at least one signal port and coupled to the data output of the second AND gate.

15. A method of an electronic device, comprising:

providing and using a functional circuit, disposed within the electronic device and coupled to at least one signal port that is to be connected to an external device externally coupled to the electronic device, to perform at least one functional operation in response to at least one control signal sent from the external device;

providing and using a test mode circuit to control the functional circuit performing at least one test operation in response to a test pattern signal sent from a verification circuit disposed within the electronic device;

performing an on-chip test and verification operation upon the function circuit by converting the test pattern signal into a plurality of test waveform signals based on a clock signal provided from the test mode circuit;

generating and outputting the plurality of test waveform signals into the test mode circuit;

receiving a plurality of test result waveform signals from the test mode circuit when the at least one test operation corresponding to the test pattern signal is performed;

converting a target pattern signal into a plurality of target result waveform signals; and comparing the plurality of test result waveform signals with the plurality of target result waveform signals to determine and output a failure result signal into the test mode circuit, the failure result signal being used to indicate whether at least one failure occurs;

wherein the electronic device is a flash memory controller chip circuit; and the method further comprises:

providing and using a memory circuit to store the test pattern signal and the target pattern signal;

providing and using a counter circuit to count and output a counting value into a comparator circuit in response to a signal edge of the clock signal;

using the comparator circuit to generate and output a trigger signal as an enable signal into a plurality of test comparison circuits respectively when the counting value is equal to a specific value; and using the plurality of test comparison circuits to:

receive a plurality of test bits of the test pattern signal to perform a serial-to-parallel conversion upon the plurality of test bits to output the plurality of test waveform signals into the test mode circuit through a plurality of input/output nodes respectively;

receive the plurality of test result waveform signals from the test mode circuit respectively through the plurality of input/output nodes; and receive a plurality of target result bits of the target pattern signal to perform the serial-to-parallel conversion upon the plurality of target result bits to generate the plurality of target result waveform signals to respectively compare the plurality of target result waveform signals with the plurality of test result waveform signals to generate a plurality of fail information bit signals so as to form and output the failure result signal.

16. The method of claim 15, wherein the electronic device is the flash memory controller chip circuit, and the external device is a host computer device.

* * * * *